US012701662B2

(12) United States Patent
Nakamura et al.

(10) Patent No.: US 12,701,662 B2
(45) Date of Patent: Aug. 4, 2026

(54) WIRING SUBSTRATE, METHOD OF TRIMMING SAME, AND MULTI-LAYERED WIRING BOARD

(71) Applicant: MITSUI MINING & SMELTING CO., LTD., Tokyo (JP)

(72) Inventors: Toshimi Nakamura, Ageo (JP); Mikiko Komiya, Ageo (JP); Yoshinori Matsuura, Ageo (JP)

(73) Assignee: MITSUI KINZOKU COMPANY, LIMITED, Tokyo (JP)

( * ) Notice: Subject to any disclaimer, the term of this patent is extended or adjusted under 35 U.S.C. 154(b) by 216 days.

(21) Appl. No.: 18/269,104

(22) PCT Filed: Dec. 10, 2021

(86) PCT No.: PCT/JP2021/045561
§ 371 (c)(1),
(2) Date: Jun. 22, 2023

(87) PCT Pub. No.: WO2022/138238
PCT Pub. Date: Jun. 30, 2022

(65) Prior Publication Data
US 2024/0080990 A1      Mar. 7, 2024

(30) Foreign Application Priority Data

Dec. 23, 2020    (JP) ................................. 2020-214312

(51) Int. Cl.
*H05K 1/02* (2006.01)
*H05K 3/00* (2006.01)
*H10P 54/00* (2026.01)

(52) U.S. Cl.
CPC ......... *H05K 3/0052* (2013.01); *H05K 1/0271* (2013.01); *H05K 1/0298* (2013.01);
(Continued)

(58) Field of Classification Search
CPC .. H05K 3/0044; H05K 1/0266; H05K 1/0298; H05K 3/0008; H05K 2201/09781;
(Continued)

(56) References Cited

U.S. PATENT DOCUMENTS 5,834,829 A * 11/1998 Dinkel .................... H01L 21/78
257/508
2005/0087878 A1* 4/2005 Uesugi .................. H01L 23/585
257/E23.002
(Continued)

FOREIGN PATENT DOCUMENTS

JP      2005-101137      4/2005
JP      2006-93407      4/2006
(Continued)

OTHER PUBLICATIONS

English Translation JP2016143728; Sakai et al.; Ibiden Co LTD; Published Aug. 8, 2016 (Year: 2016).*

*Primary Examiner* — Steven T Sawyer
(74) *Attorney, Agent, or Firm* — GREENBLUM & BERNSTEIN, P.L.C.

(57) ABSTRACT

There is provided a wiring substrate whose mechanical strength, water resistance, humidity resistance, and product yield can be improved. This wiring substrate includes a device region in which a main wiring pattern composed of a metal layer is embedded in an insulating layer; a peripheral region which surrounds a periphery of the device region and in which a dummy wiring pattern composed of a metal layer is embedded in an insulating layer; and an insulating boundary region interposed between the device region and the peripheral region, composed of an insulating layer. The insulating boundary region has a winding shape in which it is possible to draw a virtual straight line alternately traversing the metal layer constituting the dummy wiring pattern and the insulating layer constituting the insulating boundary
(Continued)

region, parallel to an inscribed line of at least one side of an outer edge of the device region.

10 Claims, 12 Drawing Sheets

(52) U.S. Cl.
CPC ........... *H05K 3/0044* (2013.01); *H10P 54/00* (2026.01); *H05K 1/0266* (2013.01); *H05K 2201/09781* (2013.01); *H05K 2201/09936* (2013.01); *H05K 2203/0228* (2013.01)

(58) Field of Classification Search
CPC . H05K 2201/09936; H05K 2203/0228; H05K 1/0306; H05K 1/0271; H05K 3/0052; H05K 3/007; H05K 2203/016; H05K 1/09; H05K 3/0011; H05K 2201/0909; H05K 3/4644; H05K 2201/0969; H01L 21/78; H01L 23/13; H01L 23/49822; H01L 23/49838; H01L 2221/68345; H01L 2224/05568; H01L 2224/05573; H01L 2224/16; H01L 2224/16225; H01L 2224/16235; H01L 2224/97; H01L 2924/00014; H01L 2924/01046; H01L 2924/01078; H01L 2924/01079; H01L 2924/1461; H01L 2924/15174; H01L 2924/15311; H01L 2224/06131; Y10T 29/49124

See application file for complete search history.

(56) References Cited

U.S. PATENT DOCUMENTS

| | | | |
|---|---|---|---|
| 2005/0269130 A1* | 12/2005 | Johnson | H05K 3/242 174/261 |
| 2006/0076651 A1 | 4/2006 | Tsutsue | |
| 2007/0002545 A1 | 1/2007 | Cho et al. | |
| 2008/0036042 A1 | 2/2008 | Sano et al. | |
| 2009/0243044 A1 | 10/2009 | Tanaka et al. | |
| 2009/0294156 A1* | 12/2009 | Ueno | H01L 23/49838 29/829 |
| 2017/0290144 A1* | 10/2017 | Hiroshima | H05K 3/4644 |
| 2019/0013212 A1 | 1/2019 | Matsuura | |
| 2019/0029125 A1 | 1/2019 | Matsuura | |
| 2020/0411396 A1 | 12/2020 | Matsuura et al. | |

FOREIGN PATENT DOCUMENTS

| | | |
|---|---|---|
| JP | 2006-332344 | 12/2006 |
| JP | 2007-19496 | 1/2007 |
| JP | 2008-66716 | 3/2008 |
| JP | 2009-239149 | 12/2009 |
| JP | 2009-290080 | 12/2009 |
| JP | 2015-35551 | 2/2015 |
| JP | 2016-72413 | 5/2016 |
| JP | 2016-143728 | 8/2016 |
| WO | 2017/150283 | 9/2017 |
| WO | 2017/150284 | 9/2017 |
| WO | 2019/163605 | 8/2019 |

* cited by examiner

L    I

10

P    B    D

L    I

10

P    B    D ( i )

110
100

( ii )

120
110
100

(iii)

T 120
110
100

(iv)

120

110

100

(v)

110

120

( iv )

( v )

WIRING SUBSTRATE, METHOD OF TRIMMING SAME, AND MULTI-LAYERED WIRING BOARD

TECHNICAL FIELD

The present invention relates to a wiring substrate and a method for trimming the same, and a multilayer wiring board.

BACKGROUND ART

In recent years, multilayering of printed wiring boards has been widely performed in order to increase the mounting density of the printed wiring boards (wiring substrates) for size reduction. Such multilayer printed wiring boards (multilayer wiring boards) are utilized in many portable electronic apparatuses for the purpose of weight reduction and size reduction. Further reduction of the thicknesses of interlayer insulating layers, and still further weight reduction as wiring boards are required of these multilayer printed wiring boards.

As a technique for satisfying such requirements, a method for manufacturing a multilayer printed wiring board using a coreless build-up method is adopted. The coreless build-up method is a method of alternately laminating (building up) insulating layers and wiring layers for multilayering, without using a so-called core substrate. For the coreless build-up method, it is proposed to use a carrier-attached metal foil for easy release between a support and a multilayer printed wiring board. For example, Patent Literature 1 (JP2005-101137A) discloses a method for manufacturing a package substrate for semiconductor device mounting, comprising affixing an insulating resin layer to the carrier surface of a carrier-attached copper foil to form a support, forming a first wiring conductor on the superthin copper layer side of the carrier-attached copper foil by steps such as photoresist processing, pattern electrolytic copper plating, and resist removal, then forming build-up wiring layers, releasing the carrier-attached supporting substrate, and removing the superthin copper layer.

For the fining of embedded circuits as shown in Patent Literature 1, a carrier-attached metal foil in which the thickness of a metal layer is 1 μm or less is desired. Accordingly, it is proposed to form a metal layer by a vapor phase method such as sputtering in order to achieve the reduction of the thickness of the metal layer. For example, Patent Literature 2 (WO2017/150283) discloses a carrier-attached copper foil in which a release layer, an antireflection layer, and a superthin copper layer (for example, a film thickness of 300 nm) are formed on a carrier such as a glass sheet by sputtering. Patent Literature 3 (WO2017/150284) discloses a carrier-attached copper foil in which intermediate layers (for example, an adhesion metal layer and a release-assisting layer), a release layer, and a superthin copper layer (for example, a film thickness of 300 nm) are formed on a carrier such as a glass sheet by sputtering. Patent Literatures 2 and 3 also teach that intermediate layers composed of predetermined metals are interposed to provide excellent stability of the mechanical release strength of the carrier, and that the antireflection layer exhibits a desirable dark color to improve visibility in image inspection (for example, automatic image inspection (AOI)).

Especially, with still further size reduction and power saving of electronic devices, the need for the high integration and thinning of semiconductor chips and printed wiring boards increases. As next-generation packaging techniques for satisfying such a need, the adoption of FO-WLP (Fan-Out Wafer Level Packaging) and PLP (Panel Level Packaging) has been studied in recent years. Also in FO-WLP and PLP, the adoption of the coreless build-up method is studied. One such a method is a method referred to as an RDL-First (Redistribution Layer-First) method in which a wiring layer, and build-up wiring layers as needed, are formed on a coreless support surface, then chips are mounted and sealed, and subsequently the support is released. For example, Patent Literature 4 (JP2015-35551A) discloses a method for manufacturing a semiconductor apparatus, comprising the formation of a metal release layer on a major surface of a support composed of glass or a silicon wafer, the formation of an insulating resin layer on the metal release layer, the formation of a Redistribution Layer comprising build-up layers on the insulating resin layer, the mounting and sealing of semiconductor integrated circuits on the Redistribution Layer, the exposure of the release layer by the removal of the support, the exposure of secondary mounting pads by the removal of the release layer, and the formation of solder bumps on the surfaces of the secondary mounting pads, and secondary mounting.

A wiring substrate having a plurality of device regions for mounting semiconductor chips or the like is also known. In such a wiring substrate, by cutting (trimming) the peripheries of the device regions, a plurality of divided small substrates can be obtained. Therefore, a wiring substrate capable of being trimmed comprises, for example, a plurality of device regions in which wiring patterns for semiconductor chip mounting are present, and a peripheral region surrounding the peripheries of these device regions and being a disposal margin. In this respect, a problem of the wiring substrate capable of being trimmed is that due to the nonuniformity of wiring pattern density between the device regions and the peripheral region, fractures, warpage, and the like occur easily.

It is known that in order to address such a problem, a dummy wiring pattern is provided in a peripheral region being a disposal margin to adjust the balance of wiring pattern density. For example, Patent Literature 5 (JP2016-72413A) discloses that regarding a semiconductor apparatus comprising a device region formed on a semiconductor substrate, and a peripheral region formed so as to surround this device region, an aperiodic pattern is formed in the peripheral region so as to surround the device region. In addition, Patent Literature 6 (JP2006-332344A) discloses that regarding a semiconductor apparatus comprising a dummy reinforcing pattern in a laminated structure of a plurality of interlayer insulating films in the peripheral edge portion of a chip region, the dummy reinforcing pattern is composed of dummy wiring and a linear dummy via. Further, Patent Literature 7 (JP2009-239149A) discloses that regarding a semiconductor wafer having a scribe line region and a plurality of device formation regions partitioned by the scribe line region, the semiconductor wafer comprises an electrically conductive pattern disposed in the scribe line region.

CITATION LIST

Patent Literature

Patent Literature 1: JP2005-101137A
Patent Literature 2: WO2017/150283
Patent Literature 3: WO2017/150284
Patent Literature 4: JP2015-35551A
Patent Literature 5: JP2016-72413A

3

Patent Literature 6: JP2006-332344A
Patent Literature 7: JP2009-239149A

SUMMARY OF INVENTION

When a wiring substrate (for example, a redistribution layer) is formed using a carrier-attached metal foil as shown in Patent Literatures 2 and 3, the step of releasing the wiring substrate from the carrier is performed. This step comprises, for example, affixing a reinforcing sheet (second carrier) to the wiring substrate, trimming the wiring substrate and the like, and releasing the combination of the trimmed wiring substrate and the reinforcing sheet from the carrier. In this respect, when the wiring substrate and the like are released from the carrier, the wiring substrate cannot be released at the position where it is trimmed, and unintended cracks (fractures, breaks, or the like) may occur in the wiring substrate. An etchant, a desmear liquid, various plating liquids, or rinsing liquids therefor, or moisture in air, dew condensation water derived therefrom, or the like enters the wiring substrate in which such cracks occur, from the cracks during a manufacturing process, and as a result, troubles such as dielectric breakdown and the corrosion of the wiring portion occur easily. On the other hand, from the viewpoint of improving the product yield, it is also desired that before the wiring substrate and the like are released from the carrier, electrical inspection is performed on the device region.

The present inventors have now found that by interposing, for trimming, an insulating boundary region having a winding shape in which it is possible to draw a virtual straight line satisfying a predetermined condition, between a device region and a peripheral region surrounding the periphery of the device region in a wiring substrate to be trimmed, the mechanical strength during and after trimming, the water resistance, the humidity resistance, and the product yield can be improved.

Therefore, it is an object of the present invention to provide a wiring substrate whose mechanical strength during and after trimming, water resistance, humidity resistance, and product yield can be improved.

According to an aspect of the present invention, there is provided a wiring substrate comprising:

a device region in which a main wiring pattern composed of a metal layer is embedded in an insulating layer;

a peripheral region which surrounds a periphery of the device region and in which a dummy wiring pattern composed of a metal layer electrically independent of the main wiring pattern is embedded in an insulating layer; and an insulating boundary region interposed between the device region and the peripheral region, composed of an insulating layer, and free from a metal layer, wherein the insulating boundary region has a winding shape in which it is possible to draw a virtual straight line alternately traversing the metal layer constituting the dummy wiring pattern and the insulating layer constituting the insulating boundary region, parallel to an inscribed line of at least one side of an outer edge of the device region, when the wiring substrate is seen in a planar view, and wherein the device region is completely separated from the virtual straight line by the insulating boundary region when the wiring substrate is seen in a planar view.

According to another aspect of the present invention, there is provided a multilayer wiring board comprising the wiring substrate.

According to another aspect of the present invention, there is provided a method for trimming a wiring substrate, comprising the steps of:

providing the wiring substrate; and cutting the wiring substrate along the virtual straight line to remove the peripheral region.

DESCRIPTION OF EMBODIMENTS

Wiring Substrate and Method for Trimming Same

Figure 1:
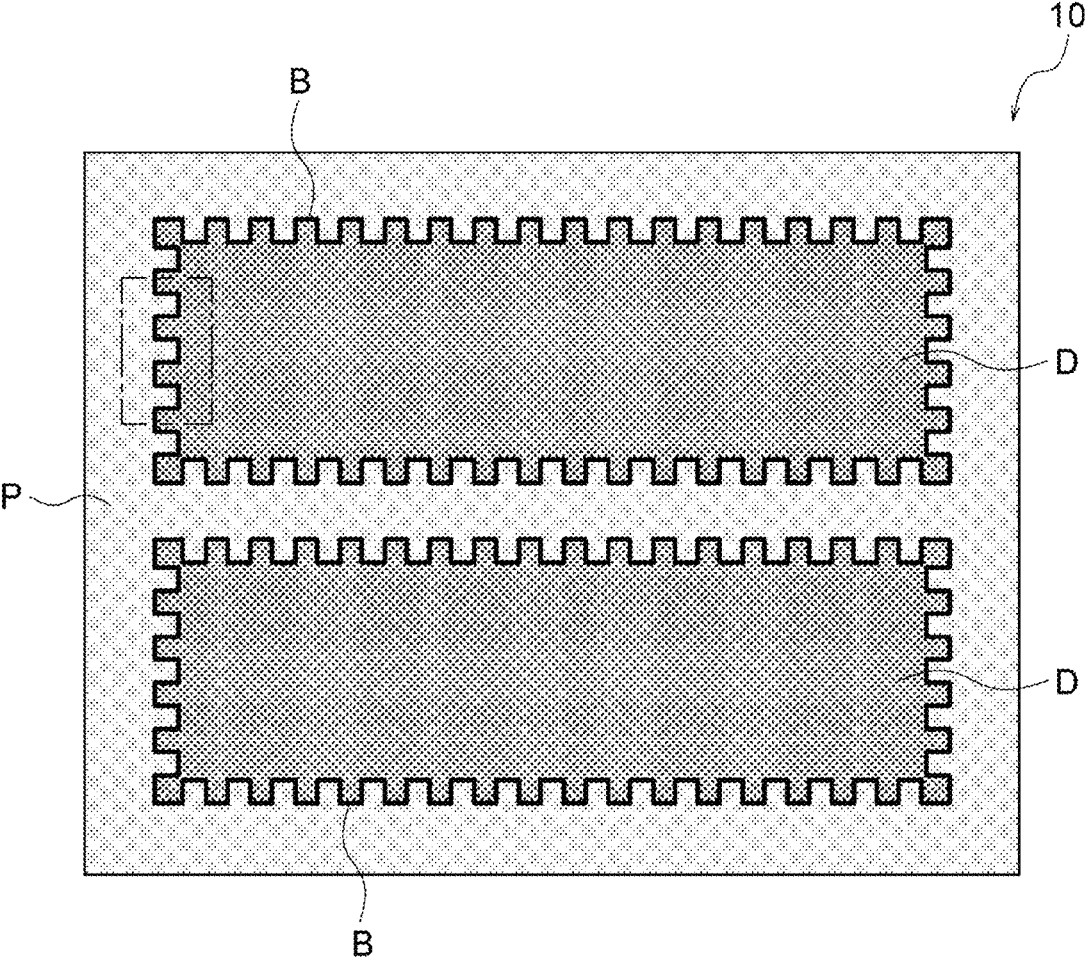
FIG. 1 is a schematic top view conceptually showing one example of the wiring substrate of the present invention.
Figure 2A:
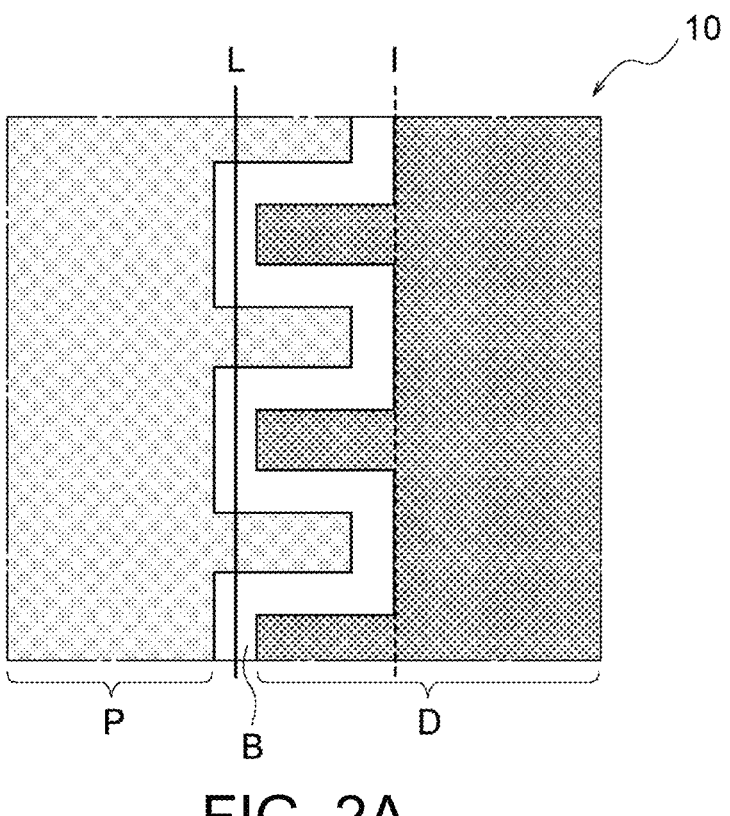
FIG. 2A is an enlarged view of the portion surrounded by the dotted line in the wiring substrate in FIG. 1 and shows one example of the shape of an insulating boundary region.
Figure 2B:
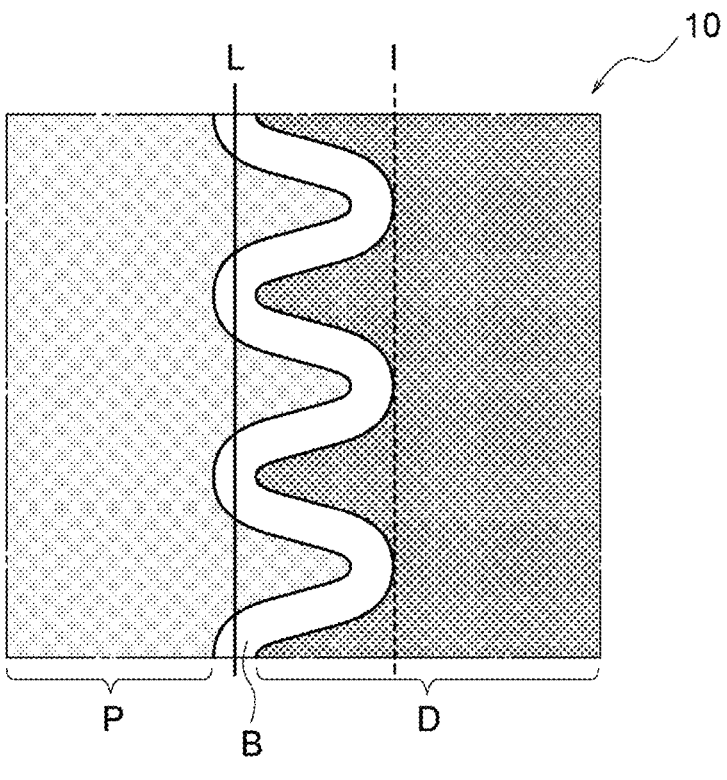
FIG. 2B shows another example of the shape of the insulating boundary region.
Figure 2C:
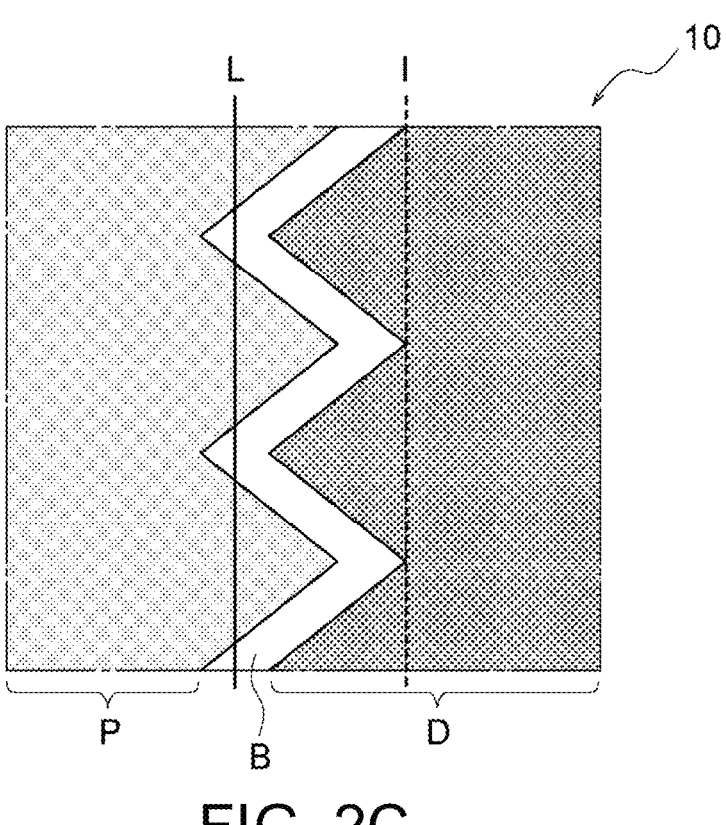
FIG. 2C shows another example of the shape of the insulating boundary region.

FIG. 1 conceptually shows the wiring substrate of the present invention, and on the other hand, FIG. 2A shows an enlarged view of the portion surrounded by the dotted line in FIG. 1. As shown in FIG. 1, the wiring substrate 10 of the present invention comprises device regions D, a peripheral region P, and insulating boundary regions B. In the device region D, a main wiring pattern composed of a metal layer is embedded in an insulating layer. The peripheral region P is a region surrounding the peripheries of the device regions D. In the peripheral region P, a dummy wiring pattern composed of a metal layer electrically independent of the main wiring pattern is embedded in an insulating layer. The insulating boundary region B is a region interposed between the device region D and the peripheral region P, composed of an insulating layer, and free from a metal layer. As shown in FIGS. 1 and 2A, the insulating boundary region B has a winding shape in which it is possible to draw a virtual straight line L alternately traversing the metal layer constituting the dummy wiring pattern and the insulating layer constituting the insulating boundary region B, parallel to the inscribed line I of at least one side of the outer edge of the device region D, when the wiring substrate 10 is seen in a planar view. The device region D is completely separated from the virtual straight line L by the insulating boundary region B when the wiring substrate 10 is seen in a planar view. By interposing, for trimming, the insulating boundary region B having the winding shape in which it is possible to draw the predetermined virtual straight line L, between the device region D and the peripheral region P surrounding the periphery of the device region D in the wiring substrate 10 to be trimmed, in this manner, the mechanical strength during and after trimming, the water resistance, the humidity resistance, and the product yield can be improved. The inscribed line I and the virtual straight line L are preferably geometrically parallel (completely parallel) but need only be substantially parallel (generally parallel) within a range that achieves the object of the present invention.

As described above, when a wiring substrate (for example, a redistribution layer) is formed using a carrier-attached metal foil as shown in Patent Literatures 2 and 3, the step of releasing the wiring substrate from the carrier is performed. Here, one example of the step of releasing the wiring substrate from the carrier is shown in FIGS. 3A to 4B. In this step, first, a wiring substrate 110 comprising device regions D, a peripheral region P, and insulating boundary regions B is formed on a carrier-attached metal foil 100 (having, for example, a carrier, a release layer, and a metal layer in this order) by a known method (for example, the above-described build-up method) (FIGS. 3A(i) and 3B(i)). Then, a reinforcing sheet 120 (second carrier) is laminated on the wiring substrate 110 via an adhesive layer or the like (FIGS. 3A(ii) and 3B(ii)). Subsequently, cuts passing through the reinforcing sheet 120 and the wiring substrate 110 are made using a cutting tool T (FIG. 3A(iii)). At this time, by making cut lines C so as to traverse the insulating boundary regions B, the device regions D and the peripheral region P surrounding the peripheries of the device regions D in the wiring substrate 110 are divided (FIG. 3B(iii)). Then, the combinations of the divided wiring substrates 110 (device region D portions) and reinforcing sheets 120 are released from the carrier-attached metal foil 100 (FIGS. 4A(iv) and 4B(iv)). Thus, the trimmed wiring substrates 110 are transferred to the reinforcing sheets 120 (FIGS. 4A(v) and 4B(v)).

Figure 5:
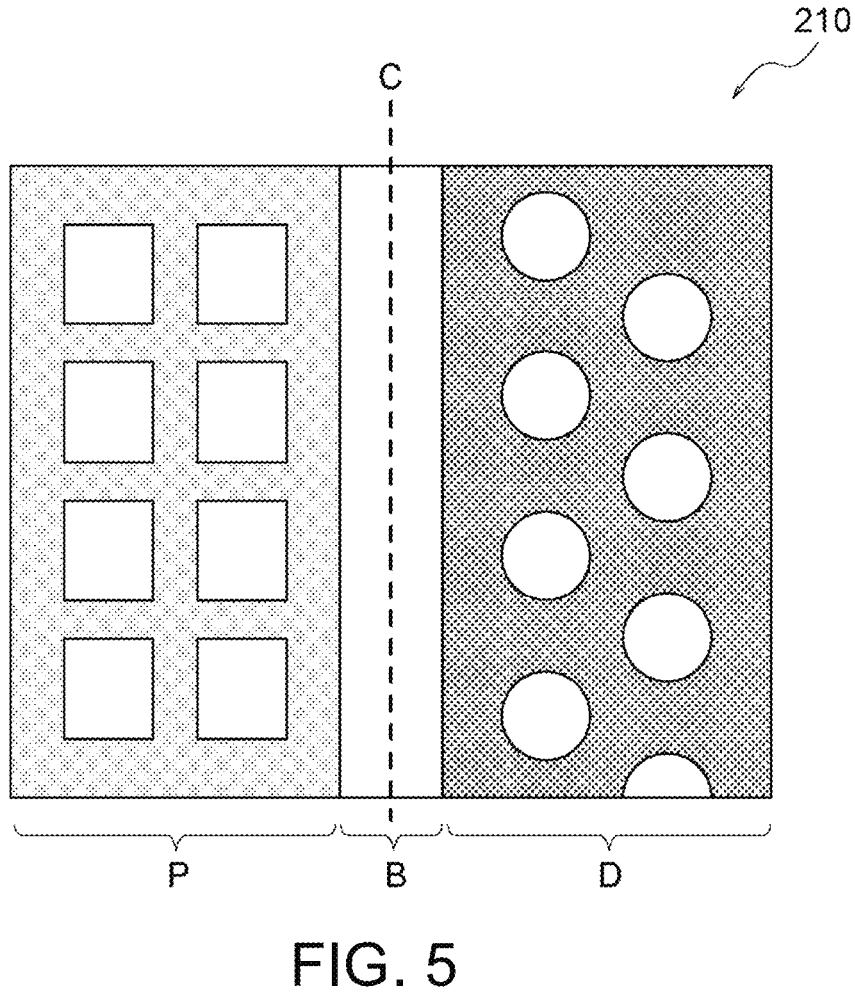
FIG. 5 is a schematic diagram showing one example of the shape of an insulating boundary region in a conventional wiring substrate.

However, when a conventional wiring substrate is released from a carrier, the wiring substrate cannot be released at the position where it is trimmed, and unintended cracks (fractures, breaks, or the like) may occur in the wiring substrate. An etchant, a desmear liquid, various plating liquids, or rinsing liquids therefor, or moisture in air, dew condensation water derived therefrom, or the like enters the wiring substrate in which such cracks occur, from the cracks during a manufacturing process, and as a result, troubles such as dielectric breakdown and the corrosion of the wiring portion occur easily. The present inventors have examined the cause of these and found out that there is a problem with the cutting place dividing the device region D and the peripheral region P. Here, one example of a conventional wiring substrate is shown in FIG. 5. As shown in FIG. 5, in a conventional wiring substrate 210, an insulating boundary region B interposed between a device region D and a peripheral region P, composed of an insulating layer, and free from a metal layer has a straight line shape. Therefore, a cut line C for dividing the device region D and the peripheral region P continuously traverses the insulating layer constituting the insulating boundary region B. It is considered that as a result, due to the low strength insulating layer constituting the insulating boundary region B, cracks occur in the wiring substrate 210 in trimming or carrier release. The combination of a metal and an insulating material in a wiring substrate is generally determined, and therefore it is difficult to change the type of the insulating material constituting the insulating layer.

In contrast to this, in the wiring substrate 10 of the present invention, the insulating boundary region B has the winding shape in which it is possible to draw the virtual straight line L alternately traversing the metal layer constituting the dummy wiring pattern (of the peripheral region P) and the insulating layer constituting the insulating boundary region B. Therefore, when the wiring substrate 10 is cut along this virtual straight line L, the insulating layer and the metal layer composed of a metal having higher strength than the insulating material constituting the insulating layer are alternately present (in the length direction, the width direction, and/or the thickness direction) in the cutting place. As a result, the wiring substrate 10 has largely improved mechanical strength compared with the conventional wiring substrate 210 in which the insulating layer is continuously present in the cutting place. In addition, when the wiring substrate 10 is seen in a planar view, the device region D is completely separated from the virtual straight line L by the insulating boundary region B. That is, even when the wiring substrate 10 is cut along the virtual straight line L, the device region D is surrounded by the insulating boundary region B. Therefore, the insulating boundary region B can effectively prevent the infiltration of moisture, such as an etchant, a desmear liquid, various plating liquids, or rinsing liquids therefor, or moisture in air, or dew condensation water derived therefrom, into the circuit and its vicinity in the device region D, and the water resistance and humidity resistance of the wiring substrate 10 improve.

Therefore, the wiring substrate 10 is preferably cut along the virtual straight lines L. That is, according to a preferred aspect of the present invention, there is provided a method for trimming the wiring substrate 10, comprising the steps of providing the wiring substrate 10; and cutting the wiring substrate 10 along the virtual straight lines L to remove the peripheral region P.

On the other hand, it is also considered that in order to improve the mechanical strength of a wiring substrate, the main wiring patterns of the device regions are connected to the dummy wiring pattern of the peripheral region so that the metal layer having high strength is present in cutting places. However, in a wiring substrate having such a configuration, the device regions and the peripheral region are not electrically independent, and therefore it is difficult to perform electrical inspection on the individual device regions at a stage before performing trimming or carrier release. In contrast to this, in the wiring substrate 10 of the present invention, the main wiring patterns of the device regions D and the dummy wiring pattern of the peripheral region P are divided by the insulating boundary regions B and are electrically independent. Therefore, for example, even at a stage before trimming or carrier release is performed on the wiring substrate 10, electrical inspection for each device region D can be performed. As a result, it is possible to proceed to the subsequent steps after identifying and grasping the defective places in the wiring substrate 10, and therefore a processing step in a subsequent step for the defective places and device regions can be omitted to more streamline the process. Further, defective products due to the defects in the wiring substrate 10 do not occur in downstream steps such as chip bonding, and therefore it is also possible to improve the final yield of a package product whose functionality and price have been increasing in recent years.

The insulating boundary region B preferably has a winding shape in which it is possible to draw the virtual straight line L alternately traversing the metal layer constituting the dummy wiring pattern and the insulating layer constituting the insulating boundary region B, parallel to the inscribed line I of each of all sides of the outer edge of the device region D, when the wiring substrate 10 is seen in a planar view. The device region D is preferably completely separated from the virtual straight lines L for the all sides by the insulating boundary region B when the wiring substrate 10 is seen in a planar view. Thus, the mechanical strength and water resistance and humidity resistance of the wiring substrate 10 can be still further improved.

The winding shape of the insulating boundary region B is not limited to the shape shown in FIGS. 1 and 2A and can be any shape, including the shapes as shown in FIGS. 2B to 2H. For example, the winding shape of the insulating boundary region B is preferably composed so that the outer edge shape of the peripheral region P in contact with the insulating boundary region B, and/or the outer edge shape of the device region D in contact with the insulating boundary region B comprise a comb shape (see, for example, FIG. 2A), a wave shape composed of a curve (see, for example, FIG. 2B), a triangle (see, for example, FIG. 2C), a trapezoid (see, for example, FIGS. 2E and 2H), a spindle shape (see, for example, FIG. 2D), a fastener shape (see, for example, FIGS. 2F and 2G), or a combination thereof, more preferably a comb shape. Thus, when the wiring substrate 10 is seen in a planar view, the boundary between the metal layer constituting the dummy wiring pattern or the main wiring pattern and the insulating layer constituting the insulating boundary region B has a complicated shape. As a result, the mechanical strength of the wiring substrate 10 during and after trimming can be still further improved. The number of the metal layers constituting the dummy wiring pattern that the virtual straight line L traverses, and the number of the insulating layers constituting the insulating boundary region B that the virtual straight line L traverses are each preferably 1 or more and 3000 or less per mm, more preferably 4 or more and 1000 or less per mm, for the length of the virtual straight line L.

Figure 2D:
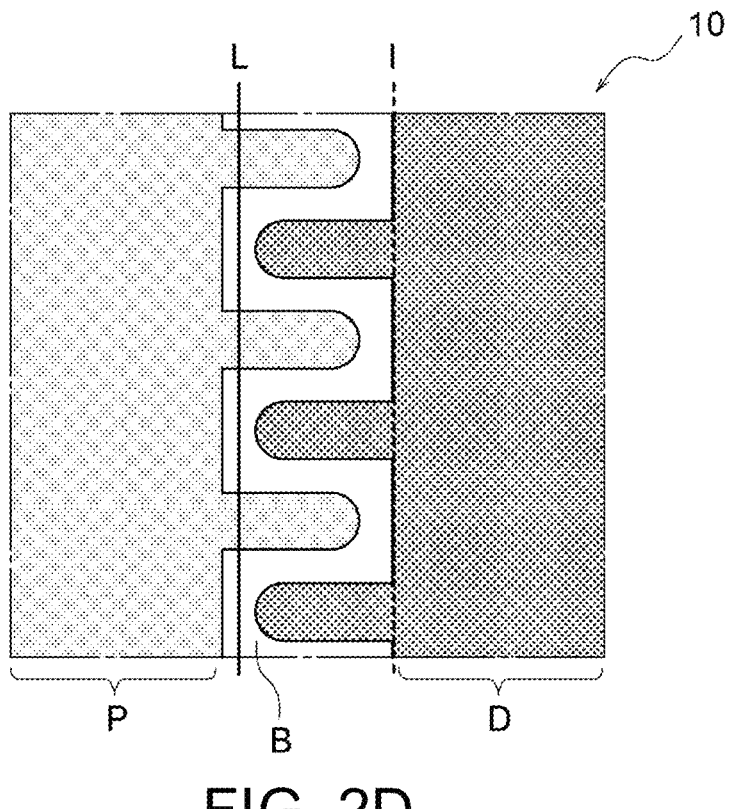
FIG. 2D shows another example of the shape of the insulating boundary region.
Figure 2E:
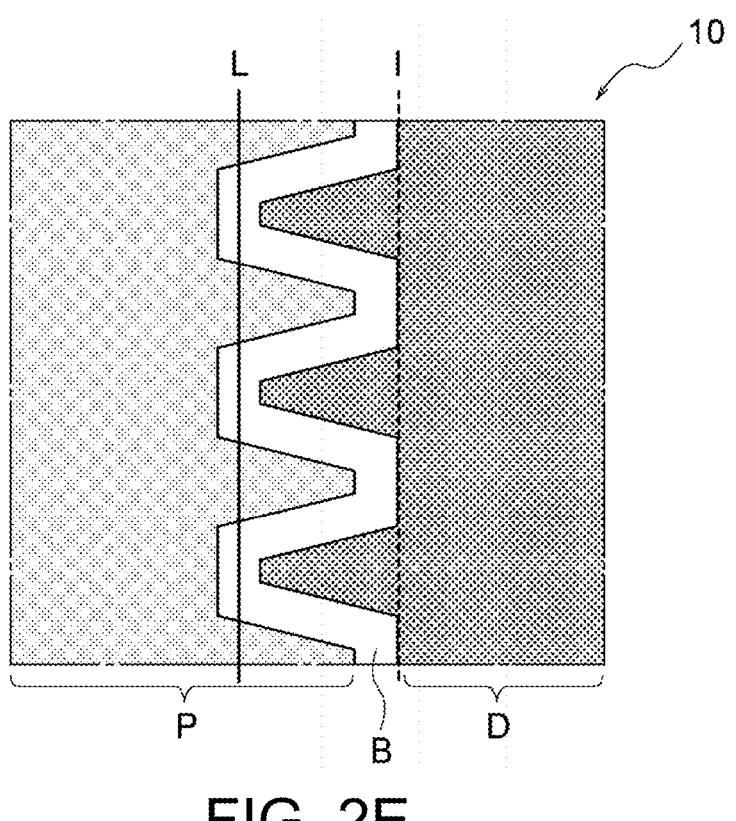
FIG. 2E shows another example of the shape of the insulating boundary region.
Figure 2F:
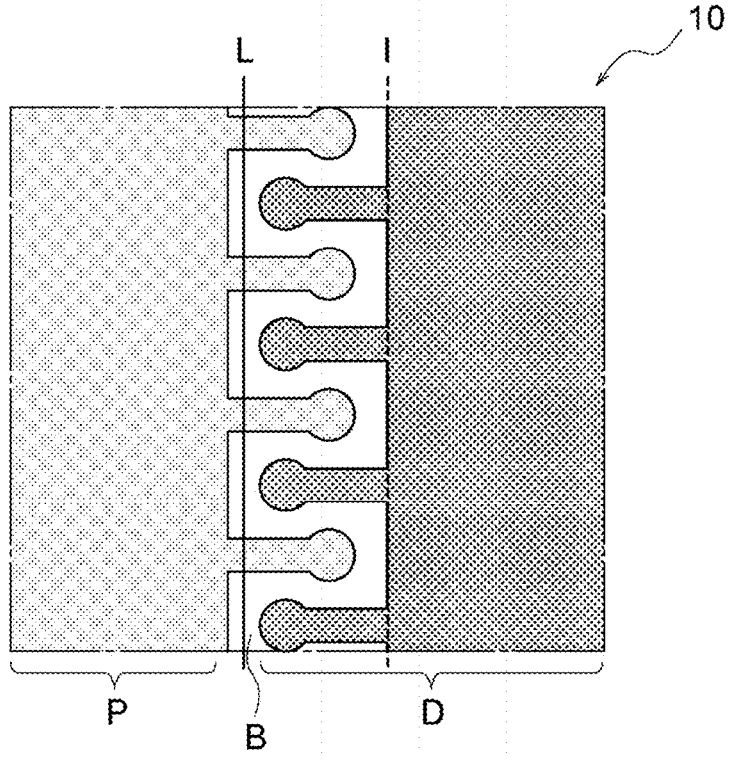
FIG. 2F shows another example of the shape of the insulating boundary region.
Figure 2G:
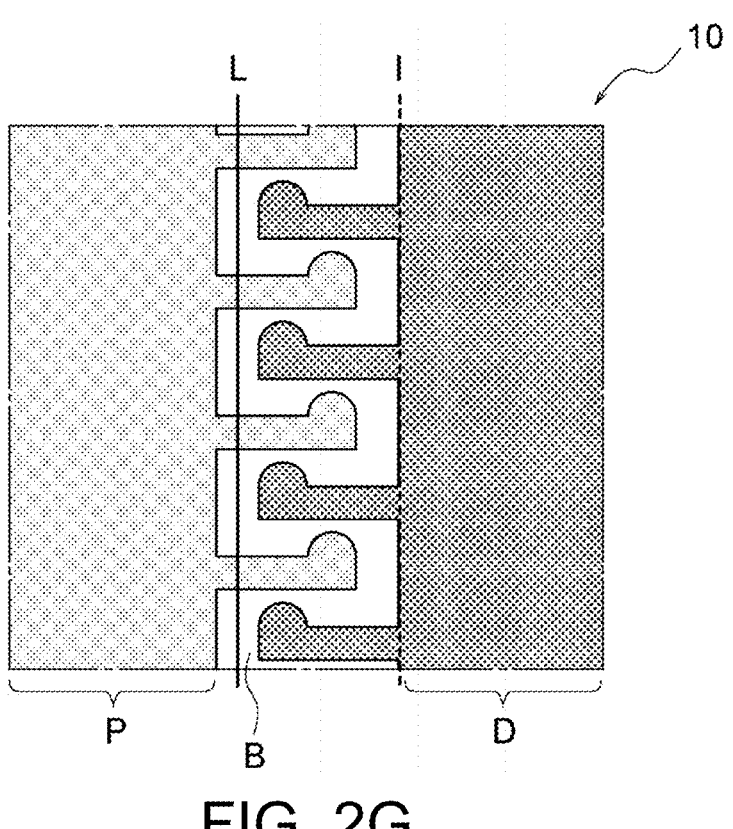
FIG. 2G shows another example of the shape of the insulating boundary region.
Figure 2H:
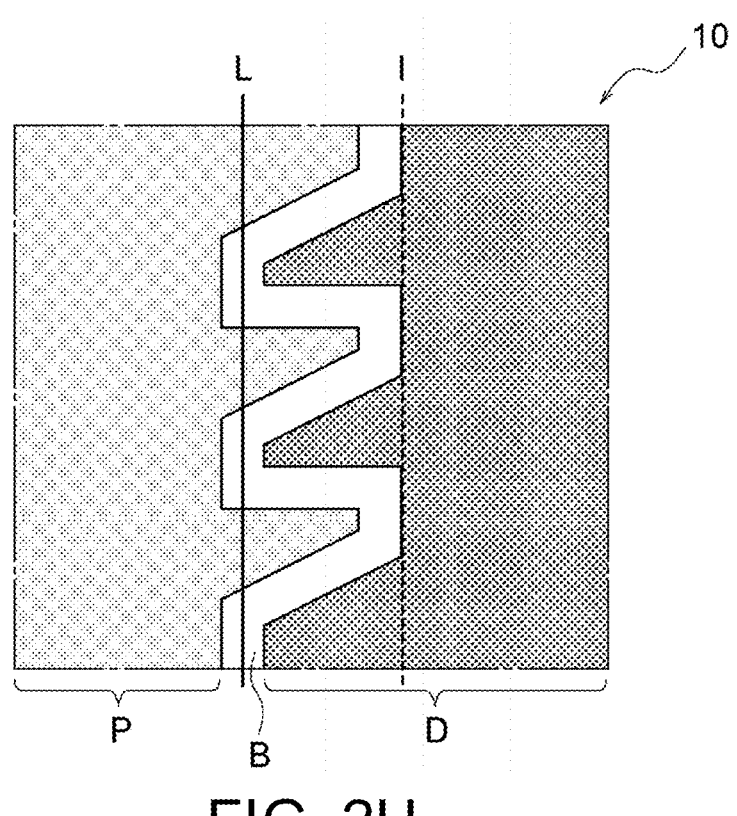
FIG. 2H shows another example of the shape of the insulating boundary region.
Figure 3A:
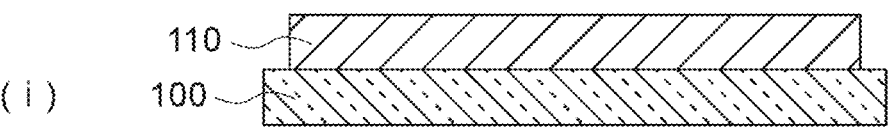
FIG. 3A is a process flow chart showing one example of a wiring substrate transfer process by a schematic cross-sectional view and corresponds to the first half step (a step (i) to a step (iii)).
Figure 3A:
Figure 3A:
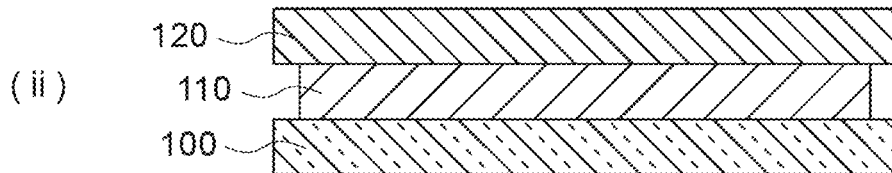
Figure 3A:
Figure 3A:
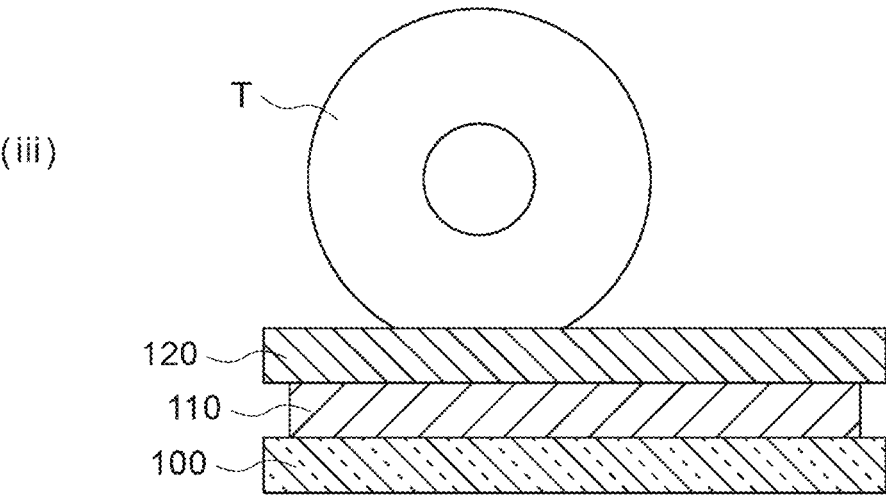
Figure 3A:
Figure 3B:
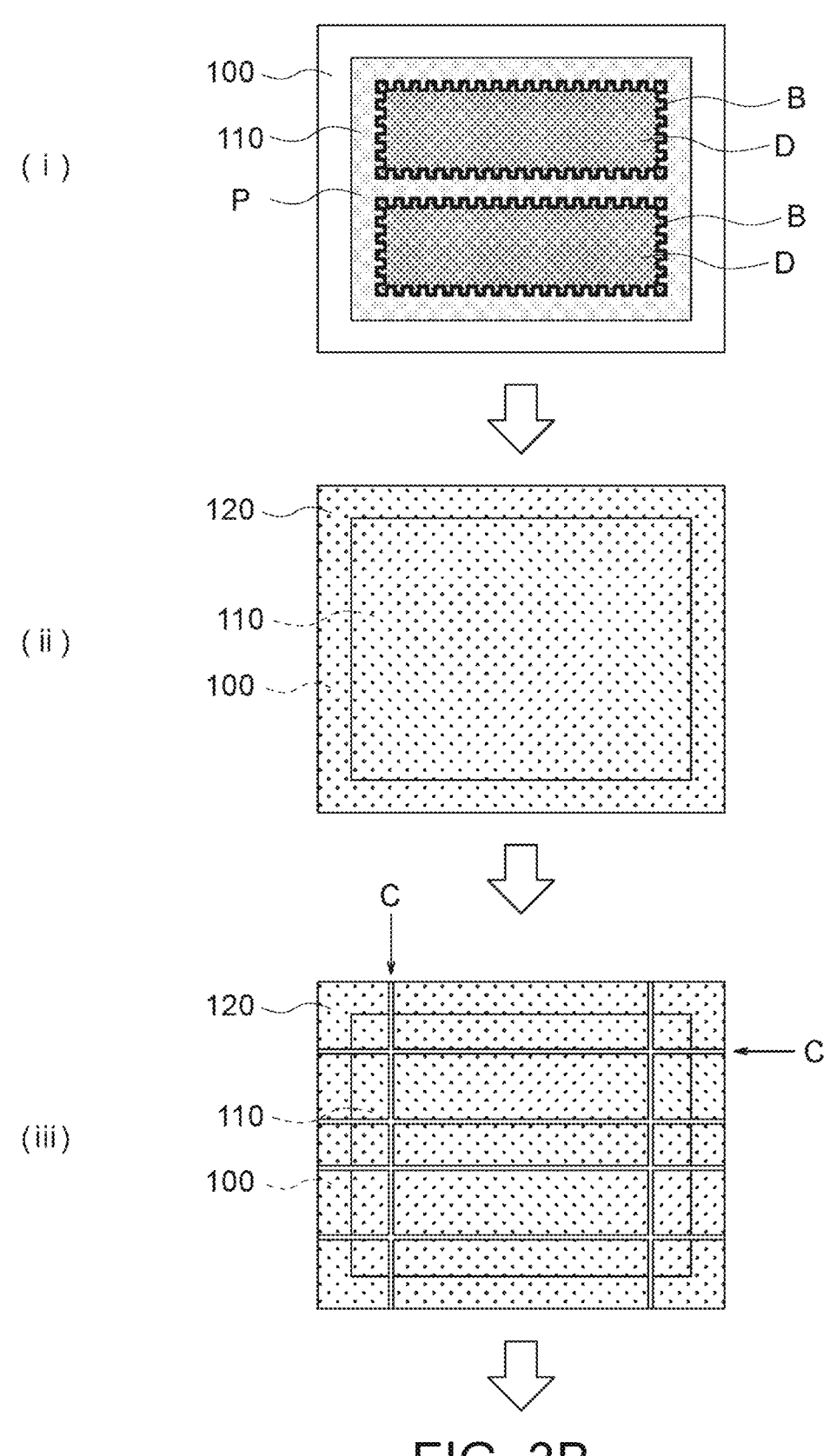
FIG. 3B is a process flow chart showing the step corresponding to FIG. 3A by a schematic top view.
Figure 4A:
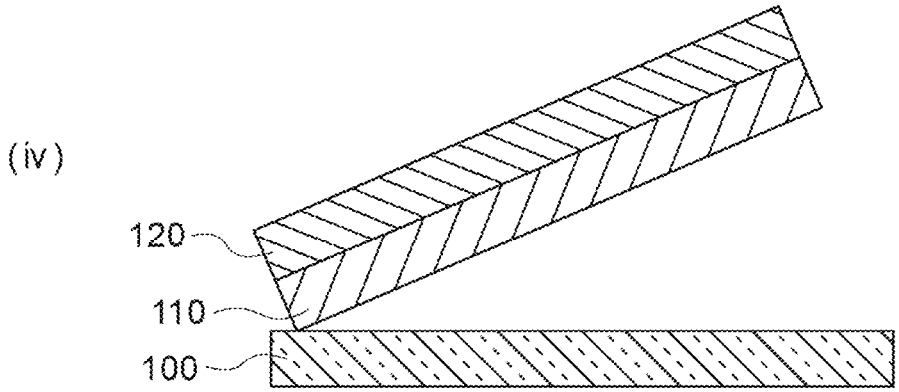
FIG. 4A is a process flow chart showing one example of the wiring substrate transfer process by a schematic cross-sectional view and corresponds to the second half step (steps (iv) and (v)) following the step shown in FIG. 3A.
Figure 4A:
Figure 4A:
Figure 4B:
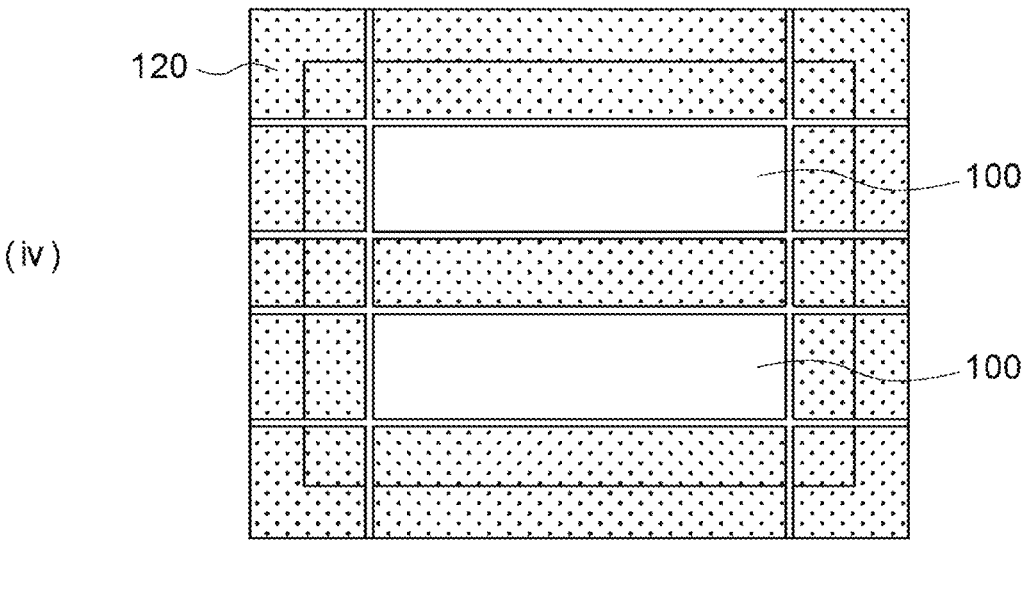
FIG. 4B is a process flow chart showing the step corresponding to FIG. 4A by a schematic top view.
Figure 4B:
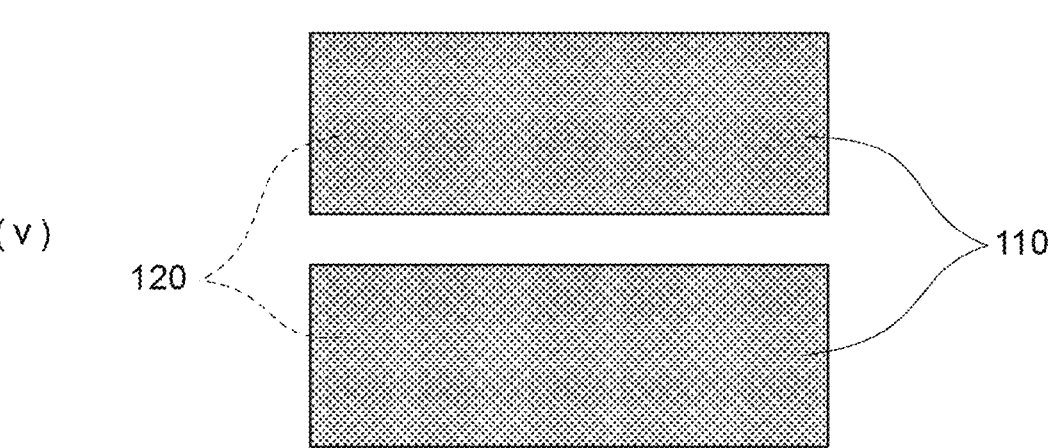

From the same viewpoint as above, the winding shape of the insulating boundary region B preferably comprises a wavy pattern. This wavy pattern preferably comprises a sine wave (see, for example, FIG. 2B), a saw wave, a rectangular wave (see, for example, FIG. 2A), a trapezoidal wave (see, for example, FIGS. 2E and 2H), a triangular wave (see, for example, FIG. 2C), or a combination thereof, more preferably a rectangular wave. The sine wave, saw wave, rectangular wave, trapezoidal wave, and triangular wave may be partially or totally modified within a range that achieves the object of the present invention. For example, the shapes of the insulating boundary region B as shown in FIGS. 2D, 2F, and 2G are included, as modifications of the rectangular wave or the trapezoidal wave, in these wavy patterns. When the width of the insulating boundary region B is constant, the design and the manufacture are easier. But at least part need not be constant within a range that achieves the object of the present invention.

The width of the insulating boundary region B (that is, the separation distance between the device region D and the peripheral region P) is not particularly limited but is typically 0.1 μm or more and 2000 μm or less, more typically 0.5 μm or more and 1000 μm or less, and further preferably 1 μm or more and 250 μm or less. The width of the insulating boundary region B is preferably 0.02 times or more and 250 times or less, more preferably 0.10 times or more and 50 times or less, the thickness t of the wiring substrate.

In the wiring substrate 10, the coefficient of linear expansion of the metal constituting the metal layer of the main wiring pattern is preferably 0.10 times or more and 10 times or less, more preferably 0.20 times or more and 5 times or less, further preferably 0.30 times or more and 3 times or less, and particularly preferably 0.50 times or more 2 times or less the coefficient of linear expansion of the resin constituting the insulating layer of the insulating boundary region B. When the coefficients of linear expansion are within such a range, the infiltration of moisture from the interface between the device region D and the insulating boundary region B can be effectively prevented, and the water resistance and humidity resistance of the wiring substrate 10 can be still further improved.

The size of the wiring substrate 10 is not particularly limited. When the substrate shape is rectangular, the size of the wiring substrate 10 is preferably 1.0 mm square or more and 150 cm square or less, more preferably 3 mm square or more and 75 cm square or less. The number of the device regions D that the wiring substrate 10 comprises is not particularly limited but is preferably 1 or more and 5000 or less, more preferably 4 or more and 2000 or less.

The wiring substrate 10 may be manufactured by any method. For example, by providing a carrier-attached metal foil comprising a release layer and a metal layer on a carrier, and laminating a wiring layer and an insulating layer on this carrier-attached metal foil using a known method, the wiring substrate 10 comprising the predetermined device regions D, peripheral region P, and insulating boundary regions B can be obtained. Therefore, the wiring substrate 10 may have a carrier and a release layer on the carrier and comprise the device regions D, the peripheral region P, and the insulating boundary regions B on the release layer. As described above, electrical inspection can be performed on the wiring substrate 10 having such a configuration even before trimming or carrier release is performed. In addition, it is possible to effectively suppress the occurrence of cracks and the like in the wiring substrate 10 when performing trimming or carrier release, and it is possible to effectively prevent the infiltration of a desmear liquid, dew condensation water, moisture in air, or the like into the circuits of the device regions D, and further the occurrence of a short circuit and migration due to these.

The carrier may be composed of any of glass, a ceramic, silicon, a resin, and a metal but is preferably a substrate comprising silicon or a glass substrate. The substrate comprising silicon may be any substrate as long as it comprises Si as an element. A $SiO_2$ substrate, a SiN substrate, a Si single crystal substrate, a Si polycrystalline substrate, and the like can be applied. The carrier is more preferably a glass carrier, a single crystal silicon substrate, or a polycrystalline silicon substrate. When the carrier is a glass carrier, advantages are that it has surface flatness (coplanarity) advantageous for fine circuit formation, that it has chemical resistance in desmear and various plating steps in a wiring manufacturing process, and that further, when the carrier is released from the wiring substrate, a chemical separation method can be adopted. Preferred examples of the glass constituting the carrier include quartz glass, borosilicate glass, alkali-free glass, soda lime glass, aluminosilicate glass, and combinations thereof, more preferably alkali-free glass, soda lime glass, and combinations thereof, and particularly preferably alkali-free glass. The alkali-free glass is glass comprising silicon dioxide, aluminum oxide, boron oxide, and alkaline earth metal oxides such as calcium oxide and barium oxide as main components, further containing boric acid, and containing substantially no alkali metals. An advantage of this alkali-free glass is that the coefficient of thermal expansion is in the range of 3 ppm/K or more and 5 ppm/K or less, low, and stable in a wide temperature zone of 0° C. to 350° C., and therefore the warpage of the glass in a process involving heating can be minimized. The thickness of the carrier is preferably 100 μm or more and 2000 μm or less, more preferably 300 μm or more and 1800 μm or less, and further preferably 400 μm or more and 1100 μm or less. When the carrier has a thickness within such a range, the thinning of wiring, and the reduction of warpage that occurs during electronic component mounting can be achieved while suitable strength that does not hinder handling is ensured.

The surface of the carrier preferably has a maximum height Rz of less than 1.0 μm, more preferably 0.001 μm or more and 0.5 μm or less, further preferably 0.001 μm or more and 0.1 μm or less, still more preferably 0.001 μm or more and 0.08 μm or less, particularly preferably 0.001 μm or more and 0.05 μm or less, and most preferably 0.001 μm or more and 0.02 μm or less as measured in accordance with JIS B 0601-2001. The maximum height Rz of the carrier surface smaller in this manner can provide a desirably lower maximum height Rz on the outermost surface (that is, the surface opposite to the release layer) of the metal layer laminated on the carrier and thus is suitable for forming a wiring pattern highly fined to such an extent that the line/space (L/S) is 13 μm or less/13 μm or less (for example, 12 μm/12 μm to 2 μm/2 μm), in a printed wiring board manufactured using the wiring substrate 10.

The release layer is a layer that allows or facilitates the release of the carrier. The release layer may be one that can be released by a method of release with a laser beam (laser lift-off, LLO), in addition to one that can be released by a method of physically applying force. That is, the release layer may be composed of a resin with which the adhesion strength of the interface decreases by laser beam irradiation after curing, or may be a layer of silicon, silicon carbide, or the like that is modified by laser beam irradiation. When the release layer is one that can be released by a method of physically applying force, even without laser irradiation, it may be either of an organic release layer and an inorganic release layer. Examples of the organic component used for the organic release layer include nitrogen-containing organic compounds, sulfur-containing organic compounds, and carboxylic acids. Examples of the nitrogen-containing organic compounds include triazole compounds and imidazole compounds. On the other hand, examples of the inorganic component used for the inorganic release layer include metal oxides or metal oxynitrides comprising at least one or more of Cu, Ti, Al, Nb, Zr, Cr, W, Ta, Co, Ag, Ni, In, Sn, Zn, Ga, and Mo, or carbon. Among these, the release layer is preferably a layer mainly comprising carbon, in terms of ease of release, film-forming properties, and the like, more preferably a layer mainly composed of carbon or a hydrocarbon, and further preferably a layer composed of amorphous carbon, a hard carbon film. In this case, the release layer (that is, a carbon-containing layer) preferably has a carbon concentration of 60 atomic % or more, more preferably 70 atomic % or more, further preferably 80 atomic % or more, and particularly preferably 85 atomic % or more as measured by XPS. The upper limit value of the carbon concentration is not particularly limited and may be 100 atomic % but is practically 98 atomic % or less. The release layer can comprise unavoidable impurities (for example, oxygen, carbon, and hydrogen derived from the surrounding environment such as an atmosphere). Due to the film formation method of the layer subsequently laminated, atoms of metals of types other than the metal contained as the release layer can be mixed into the release layer. When a carbon-containing layer is used as the release layer, the interdiffusivity and reactivity with the carrier are low, and a state in which the release and removal of the carrier is easy can be maintained even under pressing at a temperature of more than 300° C., or the like. The release layer is preferably a layer formed by a vapor phase method such as sputtering, in terms of suppressing excessive impurities in the release layer, and in terms of the continuous productivity of other layers, and the like. The thickness when a carbon-containing layer is used as the release layer is preferably 1 nm or more and 20 nm or less, more preferably 1 nm or more and 10 nm or less. This thickness is a value measured by analyzing a layer cross section by a transmission electron microscope-energy dispersive X-ray spectrometer (TEM-EDX).

Alternatively, the release layer may be a metal oxynitride-containing layer instead of such a carbon layer and the like. The surface of the metal oxynitride-containing layer opposite to the carrier (that is, on the metal layer side) preferably comprises at least one metal oxynitride selected from the group consisting of TaON, NiON, TiON, NiWON, and MoON. In terms of ensuring the adhesion between the carrier and the metal layer, the surface of the metal oxynitride-containing layer on the carrier side preferably comprises at least one metal selected from the group consisting of Cu, Ti, Ta, Cr, Ni, Al, Mo, Zn, W, TiN, and TaN. Thus, the number of foreign matter particles on the metal layer surface is reduced to improve the circuit-forming properties, and stable release strength can be maintained even after heating at high temperature for a long time. The thickness of the metal oxynitride-containing layer is preferably 5 nm or more and 500 nm or less, more preferably 10 nm or more and 400 nm or less, further preferably 20 nm or more and 200 nm or less, and particularly preferably 30 nm or more and 100 nm or less. This thickness is a value measured by analyzing a layer cross section by a transmission electron microscope-energy dispersive X-ray spectrometer (TEM-EDX).

The wiring substrate 10 may comprise other layers other than the carrier and the release layer as long as it comprises the device regions D, the peripheral region P, and the insulating boundary regions B, and as long as the essential function of the wiring substrate 10 is not impaired. Examples of such other layers include an intermediate layer, an antireflection layer (etching stopper layer), and a super-thin copper layer (metal layer) as shown in Patent Literature 2 (WO2017/150283) and Patent Literature 3 (WO2017/150284).

Multilayer Wiring Board

The wiring substrate 10 of the present invention may be a multilayer wiring board in which a wiring layer and an insulating layer are multilayered. That is, according to a preferred aspect of the present invention, a multilayer wiring board comprising the wiring substrate 10 is provided. Such a multilayer wiring board can be preferably manufactured, for example, by alternately laminating wiring layers and insulating layers on a surface of a carrier-attached metal foil by the above-described build-up method to form build-up layers, and then releasing and removing the carrier-attached metal foil. At this time, the predetermined device regions D, peripheral region P, and insulating boundary regions B are preferably composed of any layer or all layers of the multilayered wiring layer and insulating layer.

EXAMPLES

The present invention will be more specifically described by the following Examples.

Example 1

A carrier-attached metal foil was provided in which a release layer (amorphous carbon layer) and a metal layer (copper layer) were formed on a carrier by sputtering. A wiring layer and an insulating layer were laminated on the copper layer surface of this carrier-attached metal foil to fabricate a wiring substrate. The specific procedure is as follows.

(1) Provision of Carrier-Attached Metal Foil

A carrier-attached metal foil was provided in which an amorphous carbon layer (thickness 6 nm) and a copper layer (thickness 300 nm) were formed by sputtering on a glass sheet having a size of 350 mm×350 mm and a thickness of 1.1 mm (material: soda lime glass) as a carrier.

(2) Fabrication of Wiring Substrate

The surface of the carrier-attached metal foil on the copper layer side was subjected to patterning to form a wiring layer comprising main wiring patterns and a dummy wiring pattern. Specifically, first, a photosensitive dry film was affixed to the surface of the carrier-attached metal foil on the copper layer side, and exposure and development were performed to form a photoresist layer having a predetermined pattern. Then, pattern electrolytic copper plating was performed on the exposed surface (that is, the portions not masked with the photoresist layer) of the copper layer to form an electrodeposited copper plating layer, and then the photoresist layer was stripped. Thus, the copper layer and the electrodeposited copper plating layer were left in main wiring pattern and dummy wiring pattern shapes, and on the other hand, the copper layer in the portions in which these wiring patterns were not to be formed was exposed. Subsequently, the exposed unnecessary portions of the copper layer were removed with an etchant to form a wiring layer in which main wiring patterns and a dummy wiring pattern were electrically independent of each other. Further, an insulating resin material (photosensitive insulating material, AR-5100 manufactured by Showa Denko Materials Co., Ltd.) was laminated on the wiring layer side of the carrier-attached metal foil, and thermal curing treatment was performed at 230° C. for 60 minutes to form an insulating layer. Thus, a wiring substrate was fabricated which comprised device regions D, a peripheral region P, and insulating boundary regions B having a rectangular wave shape as shown in FIG. 2A.

Example 2 (Comparison)

A wiring substrate was fabricated in the same manner as Example 1 except that the wiring layer and the insulating layer were formed so that the insulating boundary regions B had a straight line shape, as shown in FIG. 5.

Evaluation

The carrier was released and removed from each of the wiring substrates fabricated in Examples 1 and 2, and then the state of the wiring substrate surface on the side from which the carrier was released was observed. The release of the carrier was performed by laminating a reinforcing sheet (prepreg, FR-4 manufactured by Panasonic Corporation, thickness 200 µm) on the surface of the wiring substrate opposite to the carrier via an adhesive layer and then releasing the carrier from the wiring substrate by hand.

Figure 6:
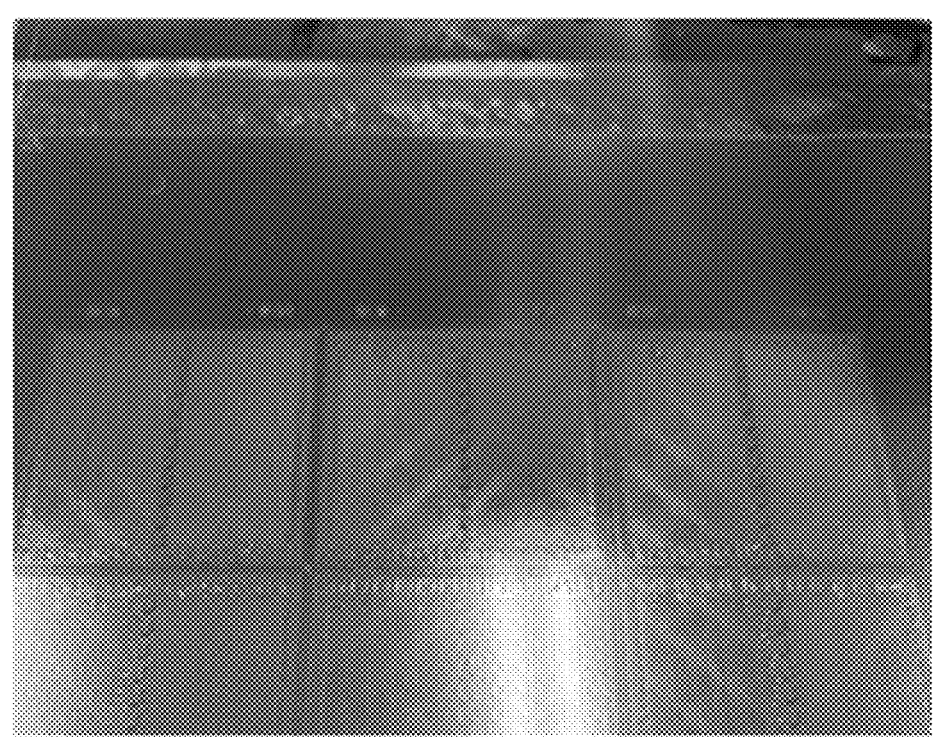
FIG. 6 is a photograph obtained by photographing the surface after carrier release, on the wiring substrate fabricated in example 1.
Figure 7:
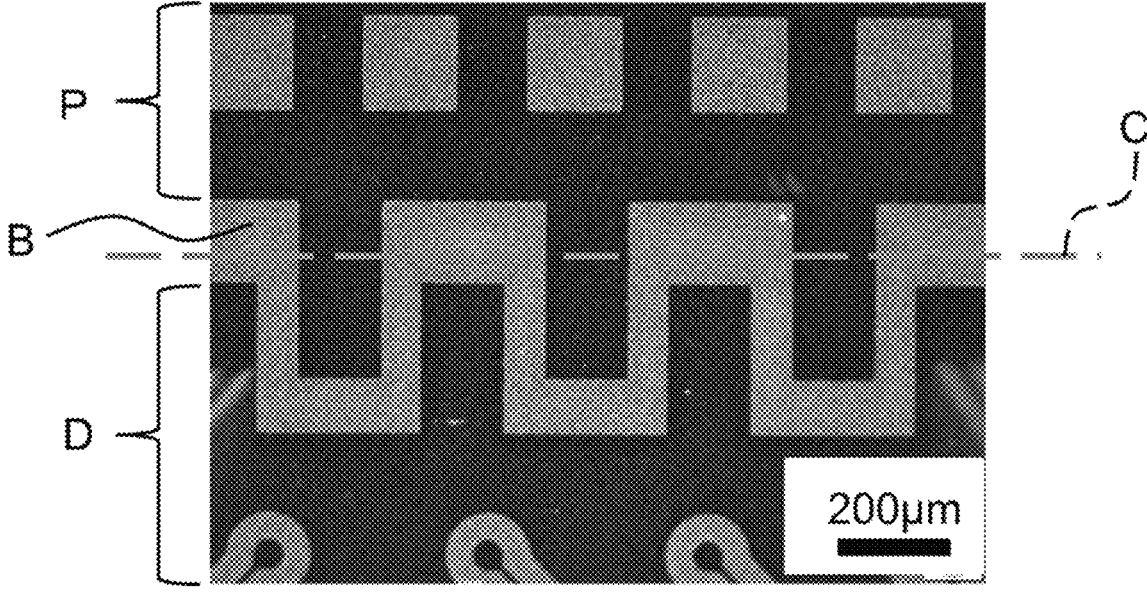
FIG. 7 is an optical micrograph of the vicinity of an insulating boundary region in the wiring substrate in FIG. 6.

When the wiring substrate surface after the carrier release, on the wiring substrate fabricated in Example 1 was photographed, the image shown in FIG. 6 was obtained. When the periphery of the insulating boundary region B of the wiring substrate of Example 1 after the carrier release was observed by an optical microscope (60×), the image shown in FIG. 7 was obtained. FIG. 7 also shows together the position of a cut line C for wiring substrate cutting. As shown in FIGS. 6 and 7, in the wiring substrate fabricated in Example 1, no fractures, breaks, or the like were seen on the surface after the carrier release. In addition, even after the wiring substrate was cut according to the cut lines C, no fractures, breaks, or the like were seen on the wiring substrate surface.

Figure 8:
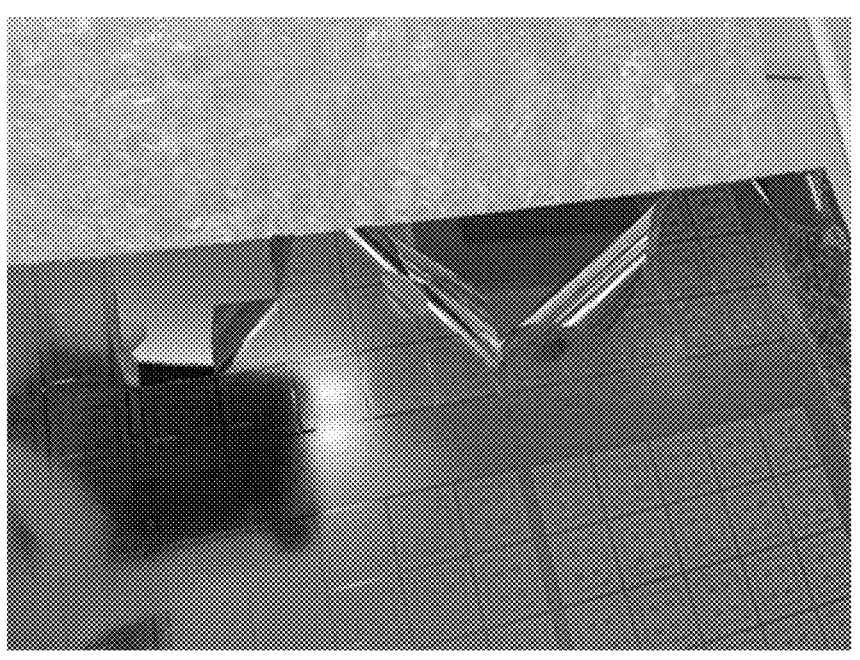
FIG. 8 is an appearance photograph obtained by photographing the substrate surface on which delamination occurs at some of individual pattern ends, on the wiring substrate fabricated in example 2.
Figure 9:
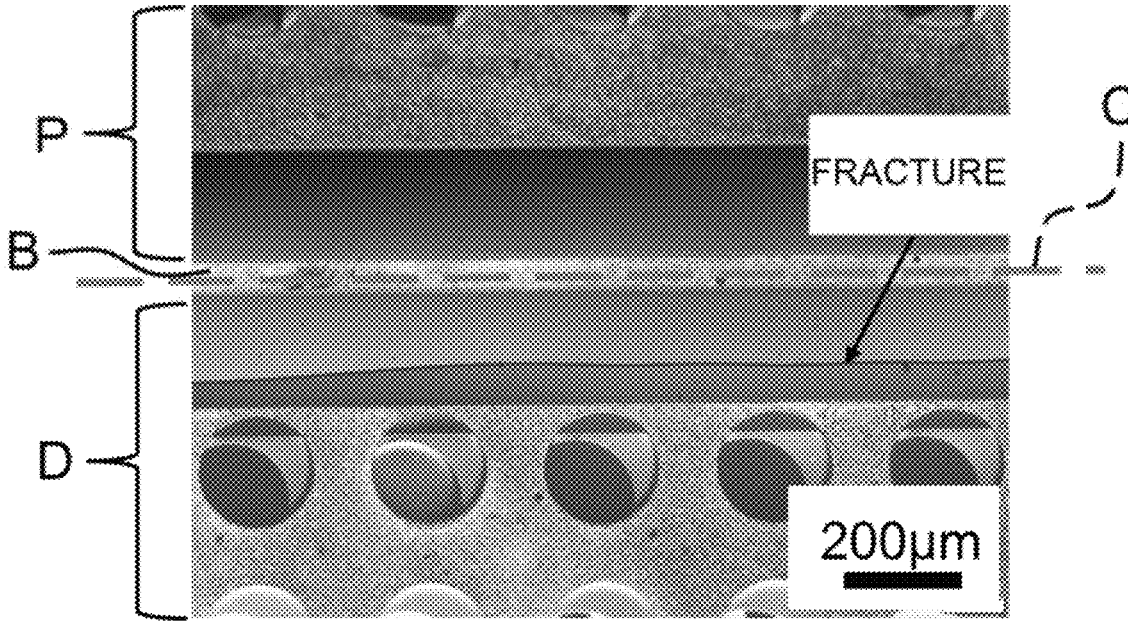
FIG. 9 is an optical micrograph of the vicinity of an insulating boundary region in the wiring substrate in FIG. 8.

On the other hand, when the wiring substrate surface on which delamination occurred at the boundaries between the patterns, on the wiring substrate fabricated in Example 2 was photographed, the image shown in FIG. 8 was obtained. When the periphery of the insulating boundary region B of the wiring substrate of Example 2 after the carrier release was observed by an optical microscope (60×), the image shown in FIG. 9 was obtained. FIG. 9 also shows together the position of a cut line C for wiring substrate cutting. As shown in FIGS. 8 and 9, it was confirmed that in the wiring substrate fabricated in Example 2, linear fractures were present on the surface after the carrier release.

From the results, in the wiring substrate comprising the insulating boundary regions having the winding shape (rectangular wave shape) fabricated in Example 1, the strength was higher and fractures were less likely to occur than in the wiring substrate comprising the insulating boundary regions having the straight line shape fabricated in Example 2.

The invention claimed is:

1. A wiring substrate comprising:
   a device region in which a main wiring pattern composed of a metal layer is embedded in an insulating layer, the main wiring pattern having peaks and valleys provided within the device region;
   a peripheral region which surrounds a periphery of the device region and in which a dummy wiring pattern composed of a metal layer electrically independent of the main wiring pattern is embedded in an insulating layer, the dummy wiring pattern having peaks and valleys provided within the peripheral region, and wherein peaks of the main wiring pattern extend into valleys of the dummy wiring pattern, and peaks of the dummy wiring pattern extend into valleys of the main wiring pattern; and
   an insulating boundary region interposed between the device region and the peripheral region, composed of an insulating layer, and free from a metal layer, wherein the insulating boundary region has a winding shape in which it is possible to draw a virtual straight line alternately traversing the metal layer constituting the dummy wiring pattern and the insulating layer constituting the insulating boundary region, parallel to an inscribed line of at least one side of an outer edge of the device region, when the wiring substrate is seen in a planar view, wherein the peripheral region is a disposal margin configured to be removed by cutting along the virtual straight line such that the device region remains surrounded by the insulating boundary region, and wherein the device region is completely separated from the virtual straight line by the insulating boundary region when the wiring substrate is seen in a planar view.

2. The wiring substrate according to claim 1, wherein the insulating boundary region has a winding shape in which it is possible to draw a virtual straight line alternately traversing the metal layer constituting the dummy wiring pattern and the insulating layer constituting the insulating boundary region, parallel to an inscribed line of each of all sides of an outer edge of the device region, when the wiring substrate is seen in a planar view, and wherein the device region is completely separated from the virtual straight lines for the all sides by the insulating boundary region when the wiring substrate is seen in a planar view.

3. The wiring substrate according to claim 1, wherein the winding shape is composed so that an outer edge shape of the peripheral region in contact with the insulating boundary region, and/or an outer edge shape of the device region in contact with the insulating boundary region comprise at least one selected from the group consisting of a comb shape, a wave shape composed of a curve, a triangle, a trapezoid, a spindle shape, and a fastener shape.

4. The wiring substrate according to claim 1, wherein the winding shape comprises a wavy pattern.

5. The wiring substrate according to claim 4, wherein the wavy pattern comprises at least one shape selected from the group consisting of a sine wave, a saw wave, a rectangular wave, a trapezoidal wave, and a triangular wave.

6. The wiring substrate according to claim 1, wherein a coefficient of linear expansion of a metal constituting the metal layer of the main wiring pattern is 0.10 times or more and 10 times or less a coefficient of linear expansion of a resin constituting the insulating layer of the insulating boundary region.

7. The wiring substrate according to claim 1, wherein the wiring substrate has a carrier and a release layer on the carrier, and comprises the device region, the peripheral region, and the insulating boundary region on the release layer.

8. The wiring substrate according to claim 7, wherein the carrier is a glass carrier.

9. A multilayer wiring board comprising the wiring substrate according to claim 1.

10. A method for trimming a wiring substrate, comprising:
   providing the wiring substrate according to claim 1; and
   cutting the wiring substrate along the virtual straight line to remove the peripheral region.

* * * * *